United States Patent
Yim

Patent Number: 6,080,678
Date of Patent: Jun. 27, 2000

[54] METHOD FOR ETCHING ANTI-REFLECTIVE COATING FILM

[75] Inventor: Myung Ho Yim, Kyungki-do, Rep. of Korea

[73] Assignee: LG Semicon Co., Ltd., Cheongju, Rep. of Korea

[21] Appl. No.: 08/884,624

[22] Filed: Jun. 27, 1997

[30] Foreign Application Priority Data

Dec. 27, 1996 [KR] Rep. of Korea ................ 96-73498

[51] Int. Cl.[7] .................................................. H01L 21/00
[52] U.S. Cl. ........................ 438/725; 438/736; 438/717; 216/47
[58] Field of Search .................. 216/49, 47; 438/736, 438/725, 717

[56] References Cited

U.S. PATENT DOCUMENTS

5,447,598 9/1995 Mihara et al. .......................... 216/46

FOREIGN PATENT DOCUMENTS

2673763 9/1992 France .
5-217883 8/1993 Japan .

OTHER PUBLICATIONS

Anisotropic etching of polymers in SO2/O2 plasmas: Hypotheses on surface mechanism, Michel Pons, et al, Unite CNRS, CNET–CNS, France–Telecom, B.P. 98, 38243 Meylan Cedex, France, (Received Aug. 17, 1993, accepted for publication Jan. 6, 1994), J. Appl. Phys. 75 (9), May 1, 1994, 1994 American Institute of Physics, pp. 4709–4715.

"Plasma Development of a silylated bilayer resist: Effects of etch chemistry on critical control and feature profiles"; Hutton et al.; pp. 2366–2371; J. Vac. Sci. Tech. B 13(6). (Nov. 1995)–ISN:0734–211x.

"Comparison of Dry Development Techniques using $O_2$ and $SO_2/O_2$ Low–Pressure Plasmas"; Pons et al.; pp. 991–996; Jpn. J. Appl. Phys., Part 1, (1994), 32(2).

*Primary Examiner*—Benjamin L. Utech
*Assistant Examiner*—George Goudreau

[57] ABSTRACT

The method for etching an organic anti-reflective coating (ARC) film includes the steps of forming an ARC film on an etching-objective layer, coating a photoresist layer on the organic ARC film, patterning the photoresist layer, and etching the organic ARC film with the photoresist pattern as a mask using a plasma of a gas mixture of $O_2$ and $SO_2$. The $SO_2$ prevents erosion of the patterned photoresist layer.

1 Claim, 3 Drawing Sheets

$O_2 + N_2$ (or $CHF_3$, $CF_4$ etc.)

METHOD FOR ETCHING ANTI-REFLECTIVE COATING FILM

BACKGROUND OF THE INVENTION

1. Field of the Invention

The present invention relates to a method for manufacturing a semiconductor device, and more particularly, to a method for etching an anti-reflective coating (ARC) film.

2. Discussion of the Related Art

To keep up with the increase in device packing density, the tendency is toward a lower critical dimension (CD). CDs are 0.8 μm for a 1 Mb device, 0.35 μm for a 64 Mb device, 0.25 μm for a 256 Mb device, and 0.18 μm for a 1 Gb device.

Thus, when using an exposure method for patterning, deep ultraviolet (DUV) is being preferred to i-line. For the future, an exposure method employing X-rays is expected to be preferred.

An aromatic polysulfone structure for a general organic anti-reflective coating film is as follows:

An anti-reflective coating (ARC) film with a constituent having the above-described aromatic polysulfone structure used in DUV microlithography.

In general, a bottom anti-reflective coating (BARC) is divided into organic constituents and inorganic constituents. Like photoresist, an ARC film of organic constituents contains constituents such as C, H, and O, and has a high viscosity. An ARC of inorganic constituents is mainly composed of elements in the $SiO_2$ system or the carbon (C) system.

A conventional method for etching an ARC film will be discussed with reference to the attached drawings. FIGS. 1a through 1c show the steps of a method for etching an organic ARC film. Referring initially to FIG. 1a, on a semiconductor substrate 1 there is formed an etching layer 2 which will be selectively etched. Next, an organic anti-reflective coating (ARC) film 3 is formed on the etching layer 2. Subsequently, a photoresist layer 4 is formed on the organic ARC film 3, and then patterned through exposure and development.

Thereafter, as shown in FIG. 1b, a down-stream type of etching process is performed by using $O_2$ plasma with the addition of $N_2$ or gases such as $CHF_3$, $CF_4$, or $C_2F_6$, which contain all fluorine (F). Otherwise, a reactive ion etching (RIE) process or an etching process using magnetic enhanced reactive ion etching (MERIE) equipment is performed. In this case, polymers 4a such as $CN_x$, $CHF_x$, or $CF_x$ are formed on both sides of the organic ARC film 3 beneath the photoresist layer 4. A loss of the upper portions of the photoresist layer 4 also takes place as shown in FIG. 1b.

When the thickness of the photoresist layer 4 having undergone erosion due to etching is designated "b" and the thickness of an effective mask (i.e., thickness of the photoresist layer 4 which did not undergo erosion and the ARC film 3) is designated "a", the value of a/b is very tiny.

Referring to FIG. 1c, after the removal of the photoresist layer 4, the etching layer 2 is selectively removed with the organic ARC film 3 serving as a mask, thereby completing the conventional etching process.

The conventional method for etching an ARC film has disadvantages. Since, in proportion to a very low value of a/b, the thickness of the portion of the photoresist layer serving as the effective mask is very small, the photoresist layer poorly serves as a mask to etch an etching-objective layer.

SUMMARY OF THE INVENTION

Therefore, the present invention is directed to a method for etching an ARC film that substantially obviates one or more problems due to limitations and disadvantages of the related art.

An object of the invention is to provide an ARC film-etching method which maximizes the thickness of a photoresist layer used as a mask to etch an etching-objective layer.

To achieve these and other advantages and in accordance with the purpose of the present invention, as embodied and broadly described, the method for etching an organic anti-reflective coating (ARC) film includes the steps of: forming an etching-objective layer on a substrate; forming an ARC film on the etching-objective layer; forming a photoresist pattern on the ARC film; and etching the ARC film using a plasma of a first gas and a second gas, the first gas etching the ARC film, and the second gas preventing erosion of the photoresist pattern.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. In order to obtain a maximum effective thickness of a photoresist layer masking an etching-objective layer when etching the organic ARC film, a gas mixture of $SO_2$ and $O_2$ is used.

Figure 2A:
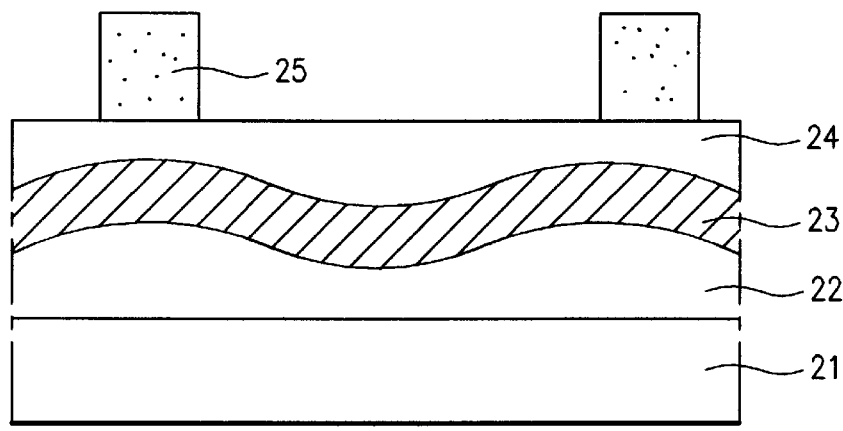
FIGS. 2a to 2c are cross-sectional views of the process steps of a method for etching an ARC film according to a preferred embodiment of the present invention.
Figure 2B:
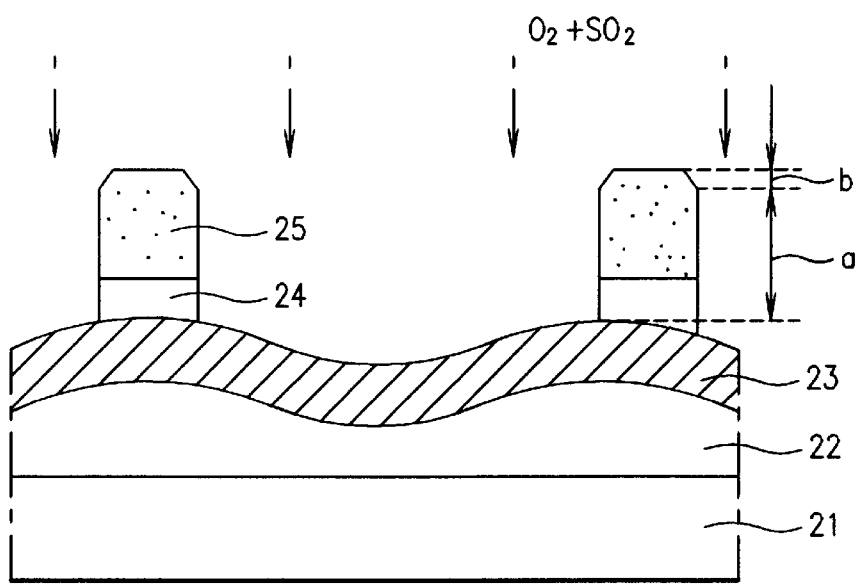
Figure 2C:
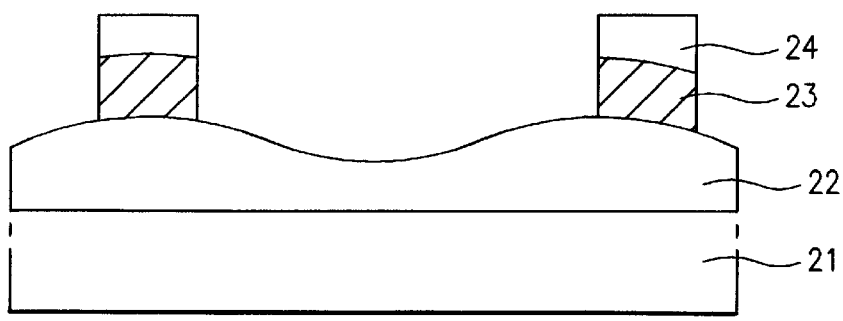

FIGS. 2a to 2c show the process steps of a method for etching an anti-reflective coating (ARC) film. First, as shown in FIG. 2a, an insulating layer 22 is formed on a semiconductor substrate 21, and an etching-objective layer 23 is formed on the insulating layer 22. An organic ARC film 24 is then formed on the etching-objective layer 23. A photoresist layer 25 is coated on the organic ARC film 24, and then patterned through exposure and development. In this case, the thickness of the organic ARC film 24 is formed to be thinner than that of the photoresist layer 25 and to have an aromatic polysulfone structure.

Secondly, as shown in FIG. 2b, the organic ARC film 24 is etched with the photoresist pattern 25 as a mask. At this time, when the above etching process is carried out, a gas mixture of $O_2$ and $SO_2$ is employed, and the etching rate of the organic ARC film 24 and the photoresist layer 25 is 1:1. As a result, the loss of the upper portion of the photoresist layer 25 can be minimized because $SO_2$ gas inhibits etching the photoresist layer 25.

Figure 1A:
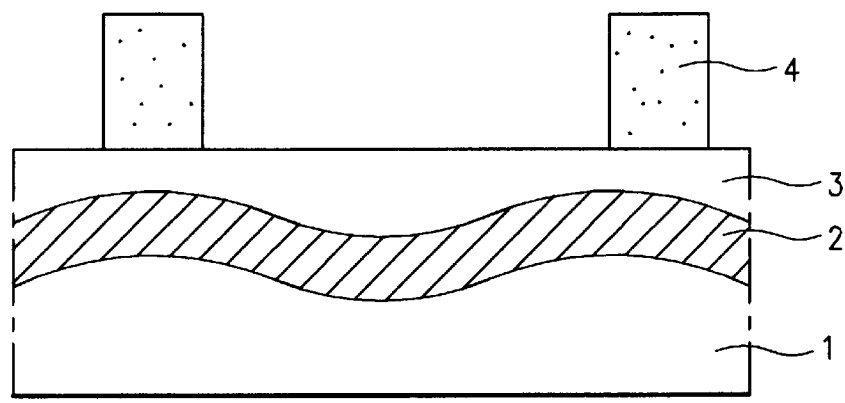
FIGS. 1a to 1c are cross-sectional views of the process steps of a conventional method for etching an anti-reflective coating (ARC) film.
Figure 1B:
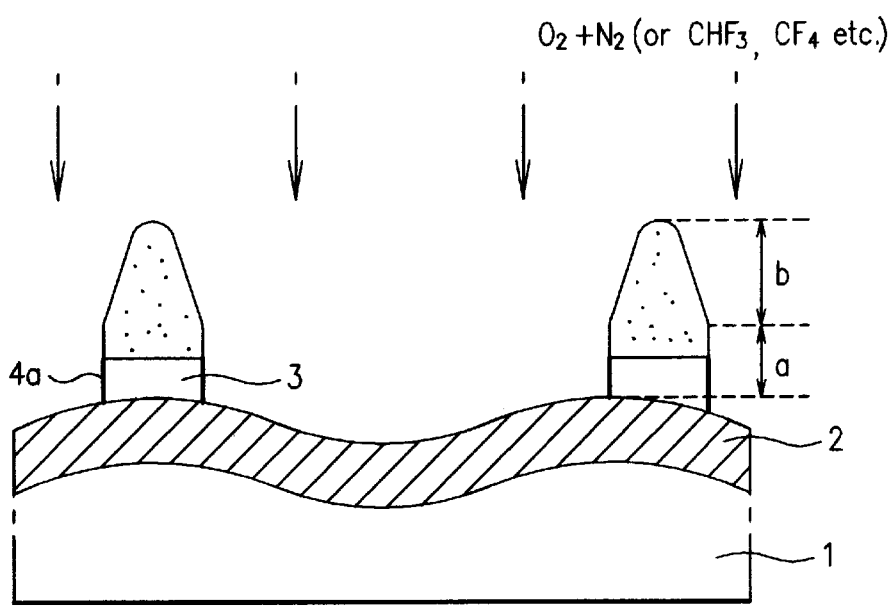
Figure 1C:
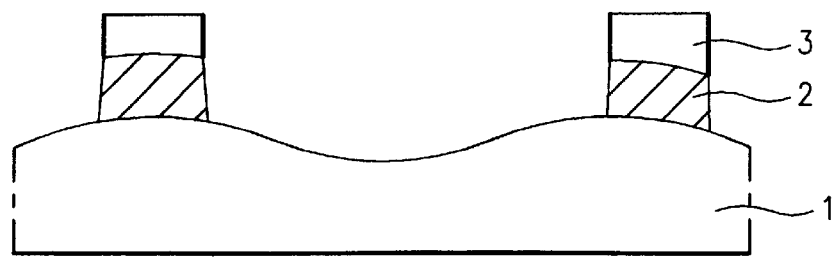

In other words, when the organic ARC film 24 is etched with the photoresist pattern 25 as a mask by employing plasma having a gas mixture of $O_2$ and $SO_2$, the $O_2$ etches the photoresist layer 25 and the organic ARC film 24, and the $SO_2$ etches the photoresist layer 25 and the organic ARC film 24 and also prevents the erosion of the photoresist layer 25. Erosion refers to the loss of the edges of a photoresist pattern 25, which is used as a mask when the organic ARC film 24 is etched. As discussed above and shown in FIG. 1b, in the prior art, the edges of the photoresist pattern are heavily eroded. It is difficult to maintain the size of the photoresist pattern when such erosion occurs.

The $SO_2$ combines with the carbon, which is contained in the photoresist layer 25 and the organic ARC film 24, to form a $CS_2$ compound. The $CS_2$ compound attaches to the sides of the organic ARC film 24 and the sides of the photoresist layer 25, and protects the sides of the organic ARC film 24 and those of the photoresist layer 25 from being etched. In other words, the $CS_2$ compound plays the role of a passivation film.

When etching the organic ARC film 24, the $O_2$ gas reacts to the photoresist layer 25 and the organic ARC film 24 so as to form CO or $CO_2$, while the $SO_2$ reacts to the photoresist layer 25 and the organic ARC film 24 so as to form $CS_2$. The $CS_2$ is not discharged because of a low vapor characteristic, but remains, instead, on the sides of the photoresist layer 25 and on the sides of the organic ARC film 24. As a result, the $CS_2$ plays the role of a passivation film to prevent the etching of the sides of the ARC film 24 and those of the photoresist layer 25.

Consequently, the thickness "b" of the photoresist layer 25 having undergone erosion is quite small, maximizing the thickness "a" of the photoresist layer 25 and the organic ARC film 24 forming the effective mask during etching of the etching objective layer 23.

In a preferred embodiment, the process conditions to etch the organic ARC film 24 in a well-known reactor or using well-known equipment such as Inductive Coupled Plasma (ICP) etch equipment, are as follows:

Flow rate of both $O_2$ and $SO_2$: 5–50 sccm.
Upper source power: 350–450 W
Lower source power: 100–300 W
Pressure: 3–10 mT According to the optimal process conditions, the flow rate of the $O_2$ is 5–15 sccm and that of the $SO_2$ is 10–30 sccm; the upper source power is 450 W and that of the lower source power is 250 W; and the pressure is 5 mT. If the organic ARC film 24 is etched according to the above-described process conditions, the ratio of a/b is about 1.2.

FIG. 2c is a cross-sectional view showing how the etching-objective layer 23 is etched with the etched organic ARC film 24 as a mask. Since the thickness of the effective mask is maximized, as shown in FIGS. 2b and 2c, the organic ARC film 24 and the etching-objective layer 23 can be precisely etched to form exact patterns.

Figure 3:
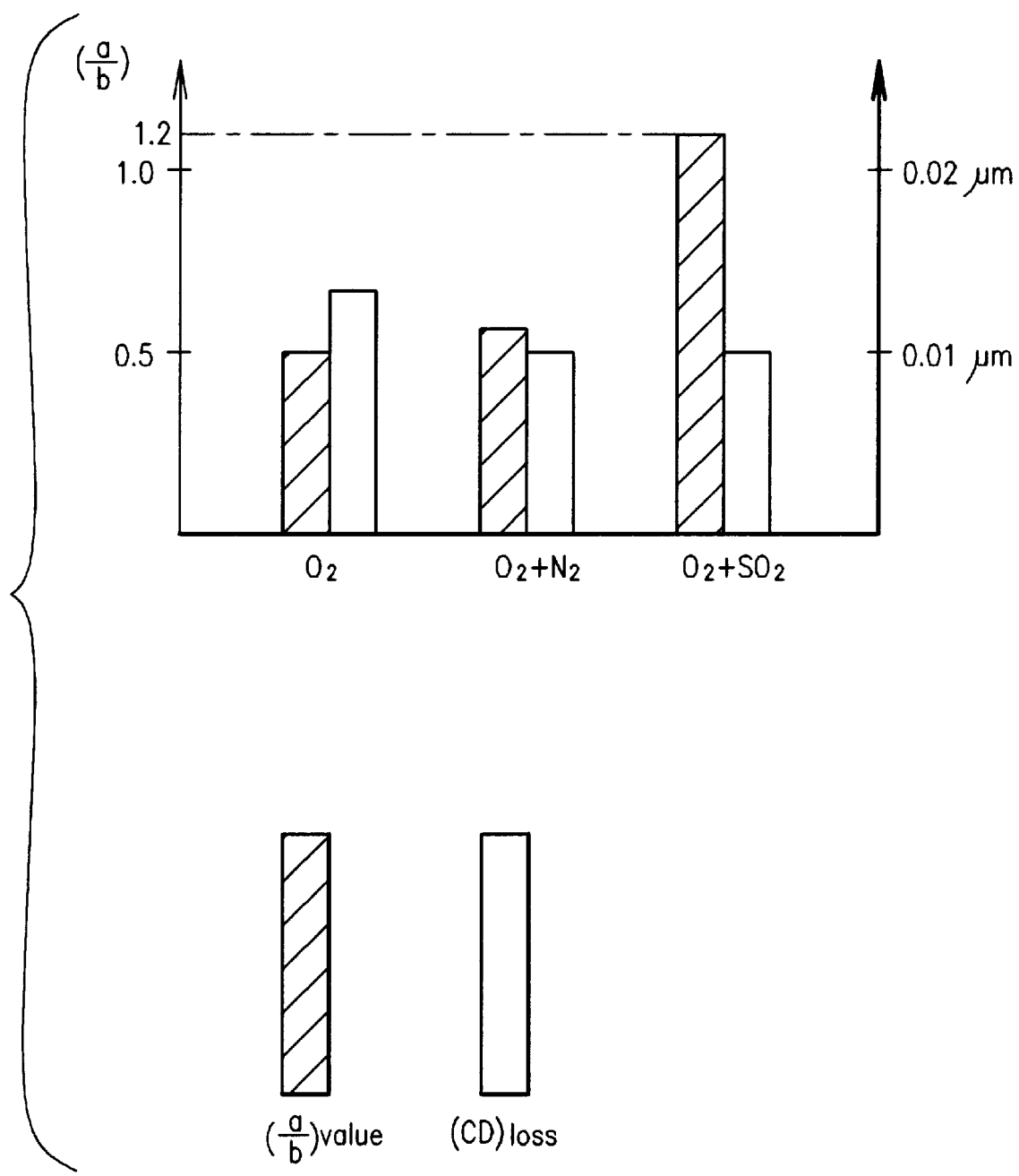
FIG. 3 is a graph showing critical dimensions obtained by the present invention and conventional techniques.

Referring to FIG. 3, there is provided a graph showing the CD loss and the value of a/b obtained according to conventional techniques and the present invention. That is to say, the graph shows the critical dimension and the value of a/b for the cases where: $O_2$ plasma is used as an etching gas according to the conventional technique; $O_2+N_2$ plasma is used as an etching gas according to the conventional technique; and $O_2+SO_2$ plasma is used as an etching gas according to the present invention.

As shown in FIG. 3, when the $O_2+SO_2$ plasma is used to etch the organic ARC film 24, the ratio a/b, which is the rate of the photoresist layer loss and the masking effective thickness, is 1.2 and the CD loss is minimized.

The method for etching an ARC film according to the present invention has several advantages. In particular, the loss of the photoresist layer used as a mask when etching the organic ARC film can be minimized to form precise pattern and to more precisely etch a layer under the photoresist layer.

It will be apparent to those skilled in the art that various modification and variations can be made in the method for etching an anti-reflective coating film of the present invention without departing from the spirit or scope of the inventions. Thus, it is intended that the present invention cover the modifications and variations of this invention provided they come within the scope of the appended claims and their equivalents.

What is claimed is:

1. A method for etching an anti-reflective coating (ARC) film, comprising the steps of:

forming an etching-objective layer on a substrate;

forming an ARC film on the etching-objective layer, the ARC film being an organic ARC film having an aromatic polysulfone structure;

forming a photoresist pattern on the ARC film to a thickness greater than a thickness of said ARC film; and etching the ARC film using a plasma of $O_2$ gas and $SO_2$ gas in ICP etch equipment, the $O_2$ gas etching the ARC film, and the $SO_2$ gas preventing erosion of the photoresist pattern by forming $CS_2$ on sides of said photoresist pattern and said ARC film, said etching step including, applying a general source power of 450 W and a general bias power of 250 W to said ICP etch equipment, setting a pressure of the ICP etch equipment to 5 mT, setting a flow rate of said $O_2$ gas to 5–15 sccm, and setting a flow rate of said $SO_2$ gas to 10–30 sccm.

* * * * *